US008258722B2

(12) United States Patent
Swoboda et al.

(10) Patent No.: US 8,258,722 B2
(45) Date of Patent: Sep. 4, 2012

(54) LIGHTING DEVICE WITH DEFINED SPECTRAL POWER DISTRIBUTION

(75) Inventors: Charles M. Swoboda, Durham, NC (US); Antony Paul Van De Ven, Hong Kong (CN); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 392 days.

(21) Appl. No.: 12/566,253

(22) Filed: Sep. 24, 2009

(65) Prior Publication Data

US 2011/0068698 A1    Mar. 24, 2011

(51) Int. Cl.
 H05B 37/02    (2006.01)
(52) U.S. Cl. .................... 315/308; 315/291; 315/312
(58) Field of Classification Search .......... 315/291, 315/297, 307, 308, 312
See application file for complete search history.

(56) References Cited

U.S. PATENT DOCUMENTS

| 4,920,257 | A | * | 4/1990 | Fuerthbauer et al. ...... 250/201.1 |
| 6,150,774 | A | | 11/2000 | Mueller et al. |
| 6,498,440 | B2 | | 12/2002 | Stam et al. |
| 7,005,679 | B2 | | 2/2006 | Tarsa et al. |
| 7,038,399 | B2 | | 5/2006 | Lys et al. |
| 7,083,302 | B2 | | 8/2006 | Chen et al. |
| 7,095,056 | B2 | | 8/2006 | Vitta et al. |
| 7,213,940 | B1 | | 5/2007 | Van De Ven et al. |
| 7,233,831 | B2 | | 6/2007 | Blackwell |
| 7,352,138 | B2 | | 4/2008 | Lys et al. |
| 7,358,679 | B2 | | 4/2008 | Lys et al. |
| 7,564,180 | B2 | | 7/2009 | Brandes |
| 2003/0030063 | A1 | | 2/2003 | Sosniak et al. |
| 2006/0149607 | A1 | | 7/2006 | Sayers et al. |
| 2007/0007898 | A1 | * | 1/2007 | Bruning .......................... 315/34 |
| 2007/0139920 | A1 | | 6/2007 | Van De Ven et al. |
| 2007/0240346 | A1 | | 10/2007 | Li et al. |
| 2008/0006837 | A1 | | 1/2008 | Park et al. |
| 2009/0050908 | A1 | | 2/2009 | Yuan et al. |
| 2009/0213120 | A1 | * | 8/2009 | Nisper et al. .................. 345/426 |

FOREIGN PATENT DOCUMENTS

| JP | 2006-080251 A | 3/2006 |
| JP | 2007-095797 A | 4/2007 |
| JP | 2009-152213 A | 7/2009 |
| KR | 10-2005-0012372 A | 2/2005 |
| KR | 10-2005-0012372 B1 | 2/2006 |
| KR | 10-0643583 B1 | 11/2006 |

OTHER PUBLICATIONS

Narendran, N., et al., "Color Rendering Properties of LED Light Sources," Solid State Lighting II: Proceedings of SPIE (2002).

* cited by examiner

Primary Examiner — Douglas W Owens
Assistant Examiner — Jianzi Chen
(74) Attorney, Agent, or Firm — Vincent K. Gustafson; Jenkins, Wilson, Taylor & Hunt, P.A.

(57) ABSTRACT

Solid state lighting devices and illumination methods involve use of multiple solid state emitters of different colored outputs (optionally including at least one white or near-white emitter). Operation of the solid state emitters is controlled with at least one circuit element to emphasize and/or deemphasize perception of at least one color of a target surface based upon a reflectance spectral distribution of the target surface. At least one emitter may have an associated passive or active filter; the filterable emitter and/or active filter may be operated to deemphasize perception of at least one color of a target surface. Activation and/or alteration of emphasis or deemphasis of perception of color of a target surface may be selected by a user or automatically controlled.

38 Claims, 7 Drawing Sheets

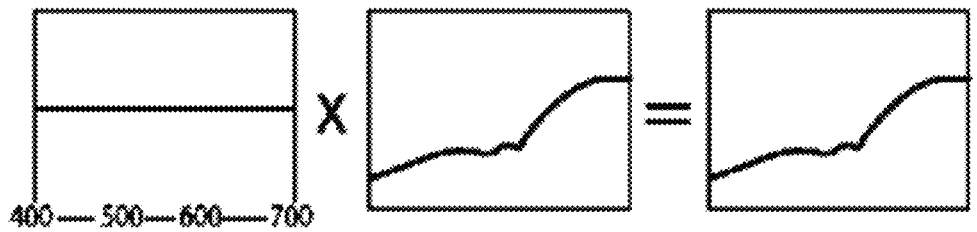
FIG._1A (RELATED ART)
FIG._1B (RELATED ART)
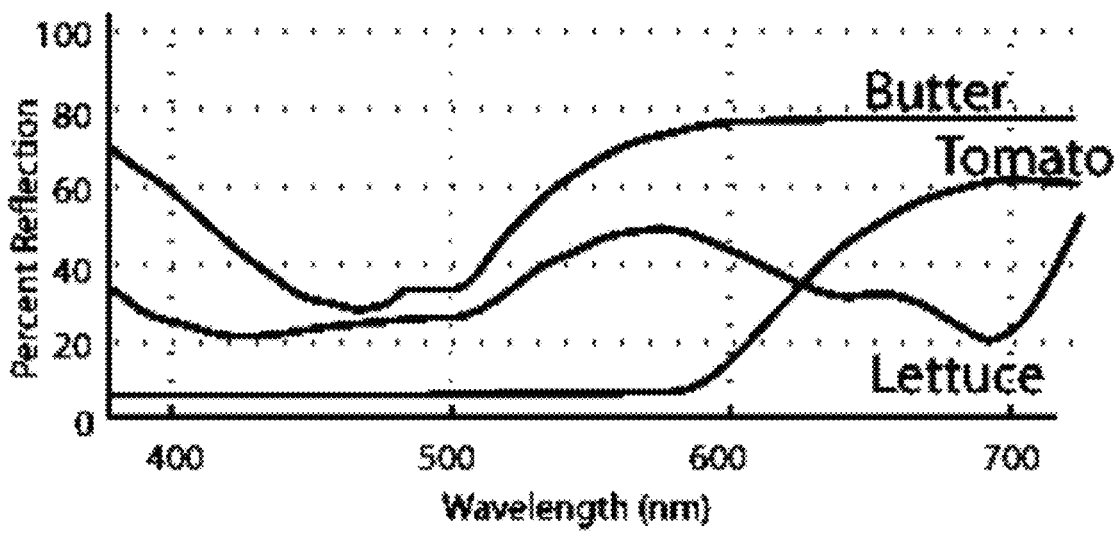
FIG._2 (RELATED ART)

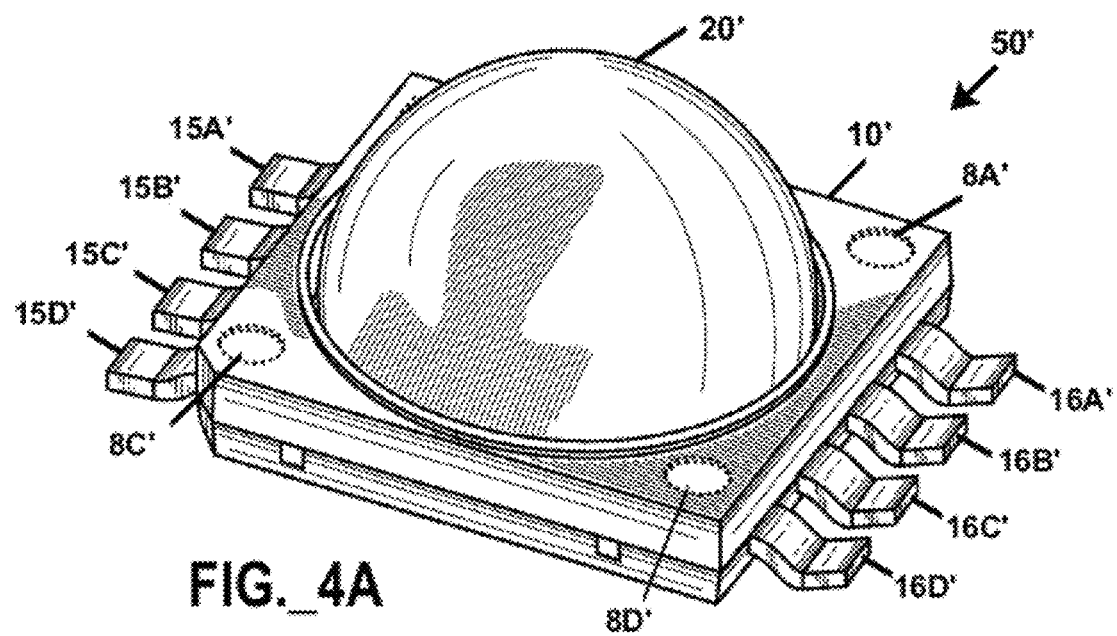
FIG._4A
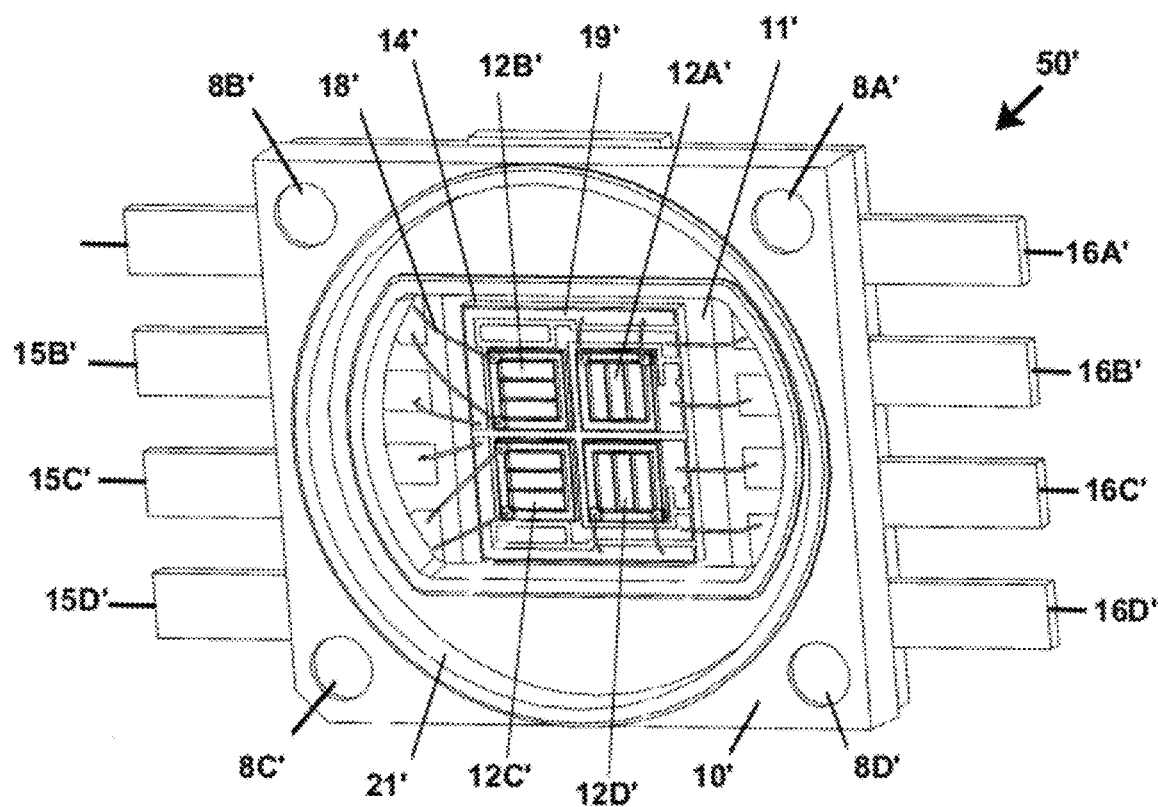
FIG._4B

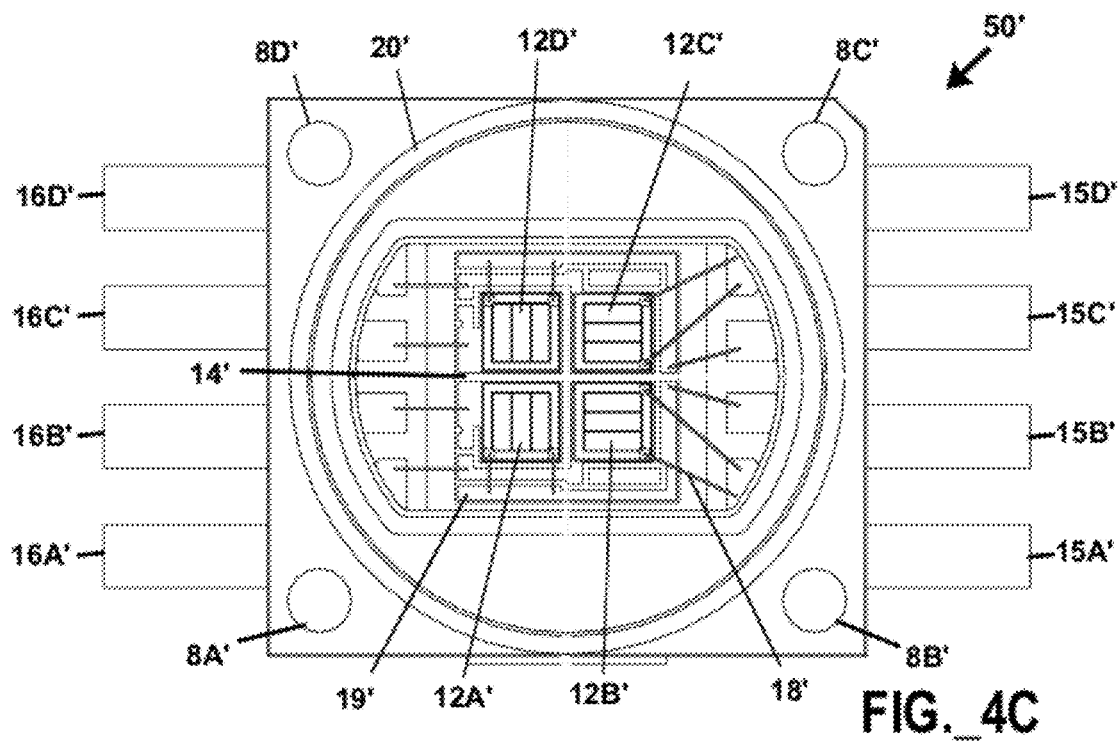
FIG._4C
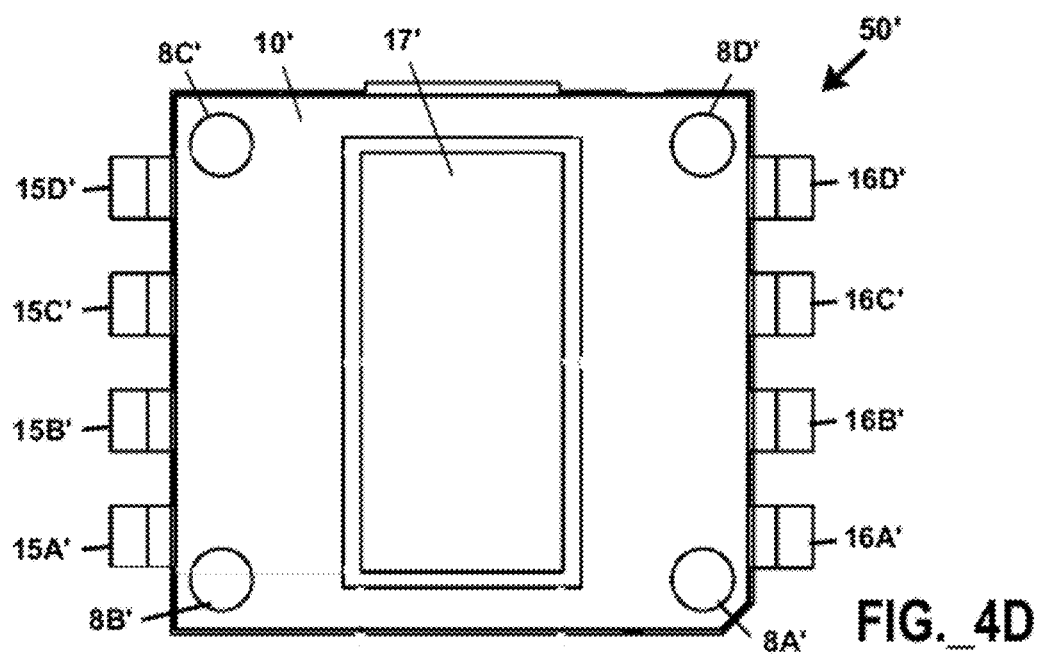
FIG._4D

LIGHTING DEVICE WITH DEFINED SPECTRAL POWER DISTRIBUTION

FIELD OF THE INVENTION

The present invention relates to solid state light emitters, systems and devices incorporating same, and illumination methods utilizing solid state light emitters.

DESCRIPTION OF THE RELATED ART

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80).

Solid state light sources may be utilized to provide colored or white LED light (e.g., perceived as being white or near-white), as has been investigated as potential replacements for white incandescent lamps. Solid state light sources are particularly desirable for their potentially high efficiency and long life relative to other (e.g., incandescent, halogen, fluorescent, etc.) light sources. A solid state lighting device may include, for example, at least one organic or inorganic light emitting diode ("LED") or a laser. A representative example of a white LED lamp includes a package of a blue LED chip, made of InGaN and/or GaN, coated with a phosphor (typically YAGrCe or BOSE). A viewer perceives an emitted mixture of blue and yellow light as white light. As an alternative to stimulating a yellow phosphor with a blue LED, another method for generating white emissions involves combined use of red, green, and blue ("RBG") light emitting diodes in a single package. The combined spectral output of the red, green, and blue emitters may be perceived by a viewer as white light. Yet another example of a method for producing white light from LEDs involves use of ultraviolet (UV) based LEDs combined with red, green, and blue phosphors, such that the combined emissions may be perceived by a viewer as white light. Various methods for generating white light from solid state emitters and phosphors are further disclosed in U.S. Pat. No. 7,213,940, which is hereby incorporated by reference as if set forth fully herein.

Visible light may be characterized by identifying the power of the light at each wavelength in the visible spectrum. The resulting spectral power distribution (or "SPD") includes the basic physical data about the light and may provide a starting point for quantitative analysis of color. SPD can be measured by a spectrophotometer, and may be represented as a SPD curve or diagram. From the SPD, both the luminance and chromaticity of a color may be derived to describe the color in the CIE system. The SPD of light from an illuminated surface is the product of the SPD of light received by the surface and a characteristic reflectance spectral distribution of the surface. To illustrate these points, FIGS. 1A-1B provide SPD diagrams (left frames) for a theoretical white source and a deluxe fluorescent lamp, respectively, plus (in the center frames) reflectance spectral distributions for a theoretical sample of human skin (center frames), and the resulting reflected SPD diagrams (right frames). As illustrated in FIG. 1A, the reflected SPD (right frame) is of the same shape as the reflectance spectral distribution (center frame) of the theoretical skin sample, as the theoretical white light source SPD (left frame) exhibits the same (i.e., flat) relative power across all wavelengths between 400 nm and 700 nm. As illustrated in FIG. 1B, a fluorescent lamp may exhibit non-linear SPD (left frame) within the wavelength range of 400 nm and 700 nm. When this non-linear SPD is applied to the theoretical sample of human skin having a characteristic reflectance spectral distribution (center frame), the resulting reflected SPD is altered relative to the reflectance spectral distribution. Relative to the theoretical white light example of FIG. 1A, the reflected SPD (right frame) shown in FIG. 1B exhibits alteration in the form of reduced red reflectance and (to a less extent) reduced blue reflectance. FIG. 2 provides visible wavelength reflectance spectral distributions for butter, tomato, and lettuce, respectively.

A SPD diagram of sunlight at midday indicates that the sun is an exceptionally balanced light source, in which all wavelengths of visible light are present in nearly equal quantities. Such even wavelength distribution provides outstanding color rendering ability. Relative to many artificial light sources, sunlight exhibits large amounts of energy in the blue and green portions of the visible spectrum, making it a cool light source with a high color temperature (about 5500K). Similar to the way that light is produced by the sun, incandescent light is produced by heating a solid object (i.e., a filament) until it radiates light. Because the blackbody radiator used to measure color rendering also generates light in this fashion, incandescent lamps score very high in CRI ratings. Although incandescent and halogen lamps do not produce as much radiant energy at the short wavelength end of the visible spectrum as sunlight, such lamps generally exhibit smooth and relatively even SPD.

In contrast to sunlight, and also in contrast to standard incandescent and halogen lamps, individual solid state emitters such as LEDs typically emit relatively narrow ranges of wavelengths. For example, each "pure color" red, green, and blue diode typically has a full-width half-maximum (FWHM) wavelength range of from about 15 nm to about 30 nm. Substantial efforts have been undertaken to broaden spectral output of devices including solid state emitters (such as by mixing light from many LEDs having different chromaticities and/or using one or more phosphors) in order to increase efficacy in general illumination applications, and to better emulate spectral power distribution characteristic of an incandescent or halogen emitter. For instance, emissions from a LED/phosphor combination that would otherwise be cool white and deficient in red component (e.g., compared to an incandescent emitter) may be supplemented with red and/or cyan LEDs, such as disclosed by U.S. Pat. No. 7,095,056 (Vitta), to achieve a desired color temperature and provide generally warmer light.

Certain end uses may benefit from emphasis or de-emphasis of perception color of a target surface. For example, produce such as lettuce is generally more appealing if green coloration of the leaves is emphasized, and/or if any undesirable yellow or brown spots on such leaves are de-emphasized. Produce such as tomatoes may similarly be more visually appealing if the red skin color thereof is vibrant, and if any yellow or green portions of the skin are de-emphasized. Jewelry may be more visually appealing if metal or gemstone portions thereof exhibit vibrant colors. Works of art may be more visually appealing if colored portions thereof appear more vibrant. While it is known to alter the color of light in certain environments (e.g., theater productions) using color gels or color filters that overlay broad spectrum (e.g., incandescent) light sources to provide noticeably colored light, it may be undesirable to utilize such an approach in other environments (e.g., a retail store) if a viewer would perceive the light as other than substantially white in color.

Thus, it would be desirable to provide a solid state light source capable of emphasizing and/or de-emphasizing perception of color of a target surface without necessarily causing a user to perceive such emphasis and/or de-emphasis. It would further be desirable to emphasizing and/or de-emphasizing perception of color of a target surface utilizing a solid state light source that would be perceived as neutral or substantially white in color. In certain situations, it would also be desirable to enable selective (or automatic) activation and/or alteration of emphasis and/or de-emphasis of perception color of a target surface. In certain situations, it may be desirable to provide a light source enabling subtle color changing utility.

SUMMARY OF THE INVENTION

The present invention relates to solid state lighting devices and illumination methods involving use of multiple solid state emitters of different colored outputs (optionally including at least one white or near-white emitter in conjunction with colored emitters), wherein operation of the solid state emitters is controlled to emphasize and/or deemphasize perception of at least one color of a target surface based upon a reflectance spectral distribution of the target surface.

In one aspect, the invention relates to a lighting device adapted to emphasize and/or deemphasize perception of at least one color of a target surface having a characteristic reflectance spectral distribution, the lighting device comprising: a plurality of solid state emitters including a first solid state emitter having peak output emissions at a first wavelength, and including a second solid state emitter having peak output emissions at a second wavelength that differs from the first wavelength; and at least one circuit element adapted to control operation of the plurality of solid state emitters to output an aggregated spectral power distribution selected to emphasize and/or deemphasize perception of at least one color of a target surface based upon the reflectance spectral distribution.

In another aspect, the invention relates to a method comprising: (a) identifying a color associated with a target surface to be emphasized or deemphasized, the target surface having a characteristic reflectance spectral distribution; (b) selecting a lighting device comprising a plurality of solid state emitters, or selecting an operating mode of a lighting device comprising a plurality of solid state emitters, to output an aggregated spectral power distribution adapted to emphasize or deemphasize the identified color based upon the reflectance spectral distribution, wherein the plurality of solid state emitters includes a first solid state emitter having peak output emissions at a first wavelength, and a second solid state emitter having peak output emissions at a second wavelength that differs from the first wavelength; and (c) illuminating the target surface with an aggregated spectral power distribution output by the plurality of solid state emitters to emphasize or deemphasize perception of the identified color.

Other aspects, features and embodiments of the invention will be more fully apparent from the ensuing disclosure and appended claims.

BRIEF DESCRIPTION OF THE DRAWINGS

FIG. 1A provides a visible range spectral power distribution diagram for an ideal white emitter (left frame), a reflectance spectral distribution for a theoretical sample of human skin (center frame), and a resulting reflected spectral power distribution diagram (right frame) for illumination of the theoretical skin sample with the ideal white emitter.

FIG. 1B provides a visible range spectral power distribution diagram for a deluxe fluorescent lamp (left frame), a reflectance spectral distribution for a theoretical sample of human skin (center frame), and a resulting reflected spectral power distribution diagram (right frame) for illumination of the theoretical skin sample with the fluorescent lamp.

FIG. 2 provides reflected spectral power diagrams for butter, lettuce, and tomato over a range of visible wavelengths.

FIG. 4A is an upper perspective view of an emitter device package substantially similar to the package of FIG. 3, with a lens covering the multiple emitter diodes.

FIG. 4B is an upper perspective view of a portion of the emitter device package of FIG. 4A, showing the package without the lens to expose the emitter diodes and associated structures.

FIG. 4C is a top view of the emitter device package portion of FIG. 4B.

FIG. 4D is a bottom view of the emitter device package of FIGS. 4A-4C.

DETAILED DESCRIPTION OF THE INVENTION, AND PREFERRED EMBODIMENTS THEREOF

Figure 3:
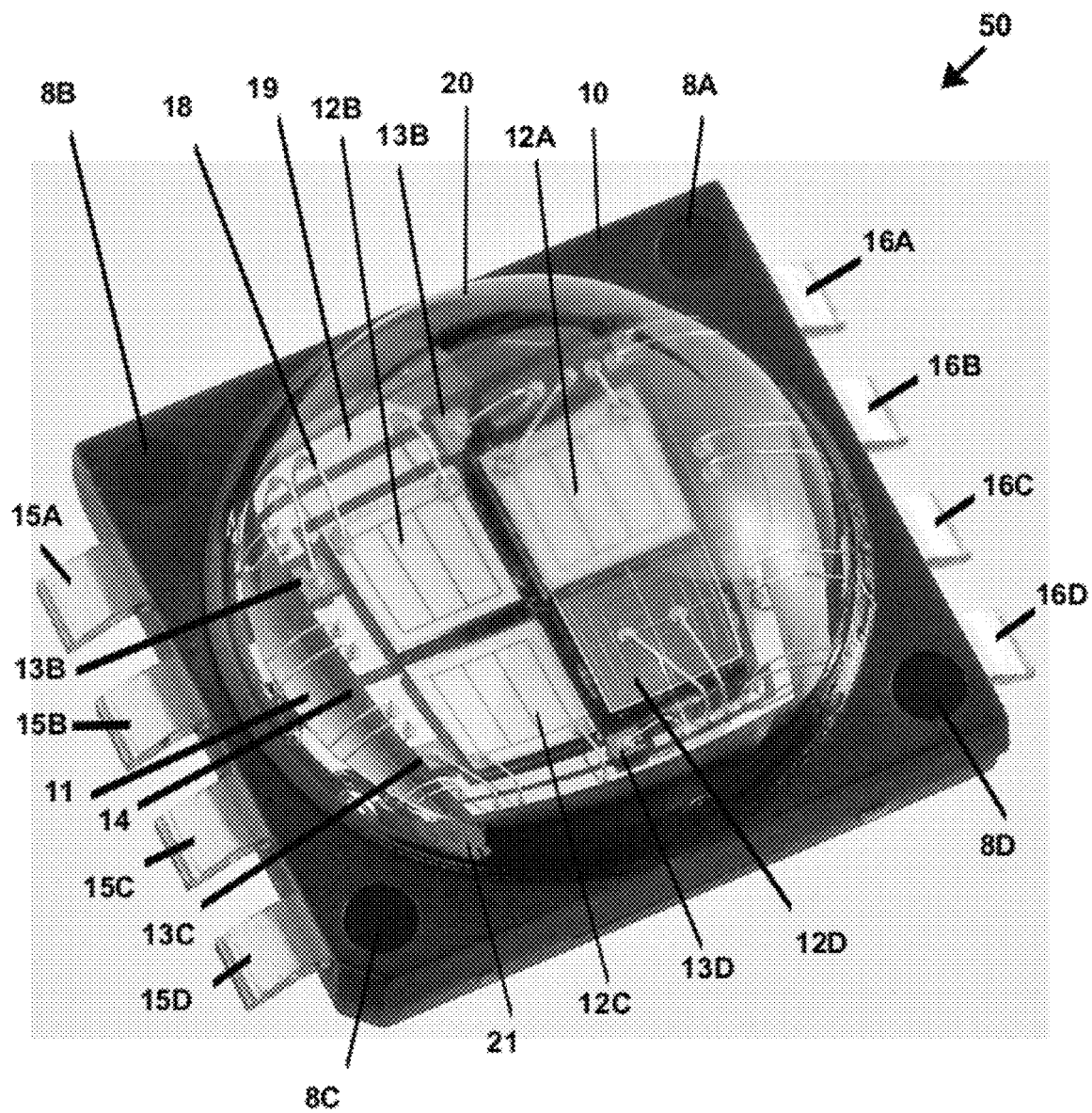
FIG. 3 is an upper perspective view of an emitter device package including four solid state emitter diodes arranged in a unitary package and capable of producing white light.

As indicated previously, the present invention relates to solid state lighting devices and illumination methods involving use of multiple solid state emitters of different colored outputs (optionally including at least one white or near-white emitter in conjunction with colored emitters), wherein operation of the solid state emitters is controlled to emphasize and/or deemphasize perception of at least one color of a target surface based upon a reflectance spectral distribution of the target surface. Individual control of current to each solid state emitter (or groups of solid state emitters) of a plurality of solid emitters enables adjustment of balance and color hues of the plurality of emitters to achieve a desired effect. An aggregated spectral power distribution of the device preferably includes white light while the solid state emitters are controlled to emphasize and/or deemphasize perception of at least one color of a target surface.

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of elements, layers, and regions may be exaggerated for clarity.

It will be understood that when an element such as a layer, region or substrate should be referred to as being "on" or extending "onto" another element, it can be directly on or extend directly onto the other element or intervening elements may also be present. In contrast, when an element should be referred to as being "directly on" or extending "directly onto" another element, no intervening elements are present. It will also be understood that when an element should be referred to as being "connected" or "coupled" to another element, it can be directly connected or coupled to the other element or intervening elements may be present. In contrast, when an element should be referred to as being "directly connected" or "directly coupled" to another element, no intervening elements are present.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide substrate such as those devices manufactured and sold by Cree, Inc. of Durham, N.C. Such LEDs and/or lasers may be configured to operate such that light emission occurs through the substrate in a so-called "flip chip" orientation.

A solid state emitter as disclosed herein can be saturated or non-saturated. The term "saturated" as used herein means having a purity of at least 85%, with the term "purity" having a well-known meaning to those skilled in the art, and procedures for calculating purity being well-known to those skilled in the art.

Various embodiments of the present invention utilize a plurality of solid state emitters including a first solid state emitter having peak output emissions at a first wavelength, and including a second solid state emitter having peak output emissions at a second wavelength that differs from the first wavelength. The plurality of solid state emitters may include a third solid state emitter having peak output emissions at a third wavelength that differs from the first wavelength and the second wavelength. A fourth solid state emitter may also be provided, with the fourth solid state emitter having peak output emissions at a fourth wavelength that differs from the first wavelength, the second wavelength, and the third wavelength. The plurality of solid state emitters may desirably include at least one LED. In one embodiment, each emitter of the plurality of solid state emitters comprises a LED.

By adjusting operation of a plurality of emitters, including emitters having peak output emissions at wavelength that differ relative to one another, an aggregated spectral power distribution may be optimized to emphasize and/or deemphasize perception of at least one color of a target surface. Emphasis of perception of a particular color of a target surface may be achieved by adjusting spectral output of one or more emitters to achieve a local peak of spectral output. For example, if a lighting device includes separately controllable red, green, blue, and white LEDs, a red color associated with a target surface (e.g., a tomato) may be emphasized by any of the following operating modes: (i) increasing current to the red LED relative to other emitters; (ii) decreasing current to the green and blue LEDs; or (iii) some combination of increasing current to the red LEDs and decreasing current to the green and blue LEDs. Other operating modes (e.g., supplying equal current to each LED, or deactivating each of the red, blue, and green LEDs) may result in no emphasis or deemphasis of a particular color of a target surface. Depending on the output level of the white emitter, the aggregated spectral output of the lighting device may be perceived as generally white during any of the foregoing possible operating modes. In one embodiment, total lumen output from multiple emitters is regulated to maintain a substantially constant value (or constant perceived value, since human perception of brightness is color-dependent), despite changes in operating mode (e.g., while the lighting device or plurality of solid state emitters thereof is subjected to a change in operating mode). For example, in a multi-emitter device including red, green, blue, and white (or near-white) solid state emitters, current to the blue and green emitters (and/or the white emitter) may be reduced concurrent with an increase of current to the red emitter (e.g., to emphasize perception of the color red on a target surface) to maintain substantially constant lumen output or perceived lumen output in the aggregate from all of the emitters.

In one embodiment, the aggregate spectral power distribution is selected to emphasize perception of a color of a target surface. In another embodiment, the aggregate spectral power distribution is selected to deemphasize perception of a color of a target surface. In another embodiment, the aggregate spectral power distribution is selected to emphasize perception of a first color of a target surface, and to simultaneously deemphasize perception of a second color of a target surface. For example, if a lighting device including red, green, blue, and white (or near-white) emitters is used to illuminate a tomato, current to a red solid state emitter may be increased and current to a green solid state emitter may be decreased, to enhance perception of red (indicative of ripeness and increased appeal) on the tomato skin (target surface) and simultaneously decrease perception of green (indicative of unripe condition) on the tomato skin.

In one embodiment, at least one circuit element is pre-arranged or pre-set to control operation of multiple solid state emitters within a lighting device (without capability to adjust such operation) to emphasize and/or deemphasize perception of at least one color of a target surface based upon a reflectance spectral distribution of a target surface. For example, at least one circuit element may include one or more elements to limit electric current to one or more emitters within a multi-emitter device. A lighting device may thus be pre-set and installed without adjustment to emphasize perception of a specific color of a target surface, to de-emphasize perception of a specific color of a target surface, or to emphasize perception of a first color of a target surface and simultaneously deemphasize perception of a second color of a target surface. In certain embodiments, the at least one circuit element may include a memory (e.g., arranged to store settings relating to operating mode or programming instructions, and/or to store information received from one or more sensors relating to reflectance spectral distribution or reflected spectral power distribution of a target surface, and/or to store information received from one or more sensors (e.g., time, temperature, pressure, shock, voltage, and/or current) relating to device operation. In certain embodiments, the at least one circuit element may include a microprocessor arranged to executed one or more predefined or user-defined instruction sets.

In one embodiment, at least one circuit element is arranged to receive input from a user to adjust operation of multiple solid state emitters within a lighting device, to emphasize and/or deemphasize perception of at least one color of a target surface based upon a reflectance spectral distribution of a target surface. Inputs may be continuously variable (e.g., utilizing analog variable resistors or the like to permit adjustment of operation of one emitter or multiple emitters) or inputs may enable selection of one or more different predetermined operating settings or states that cause the plurality of solid state emitters to output an aggregated spectral power distribution selected to emphasize and/or deemphasize perception of at least one color of the target surface. In one embodiment, a user input element may include at least one manually operable button, dial, slider, or switch. In one embodiment, a user input element comprises an electronic device interface (e.g., a wall-mounted touch screen, personal computer, a smart phone, personal data assistant, or the like). In another embodiment, the user input element may include a wireless receiver adapted to receive an input signal from an associated wireless transmitter (not shown) to effectuate alteration of emphasis and/or deemphasis of perception of color of at least one target surface, whether by adjusting operation of one or more emitters individually, or by selection of one or more predetermined operating settings.

In one embodiment, a lighting device may have multiple different predetermined operating settings or states that cause the plurality of solid state emitters to output an aggregated spectral power distribution selected to emphasize and/or deemphasize perception of at least one color of the target surface, and switching (or cycling) between settings or states may occur automatically (e.g., on a continuous or substantially continuous basis) by a predetermined switching pattern and duration, or according to a sequence programmable by a user. Automatic switching may include switching between predefined discrete operating settings, substantially continuous variation of one or more colors in a regular pattern, or substantially continuous variation of one or more colors in a random or quasi-random pattern.

In one embodiment, a solid state lighting device including multiple emitters of different colors may include multiple predefined operating states or settings specifically designed to emphasize and/or deemphasize perception of at least one color for illumination of specific types of target surfaces. Any of the following items, or subsets thereof, may have one or more corresponding operating states programmed or otherwise defined in a multi-emitter solid state lighting device: printed material, natural objects, painted artworks, skin tones, natural produce, baked goods, stone, wood, fabrics, gemstones, jewelry, painted metal, automobiles, and the like. In the case of painted or coated surfaces, spectral power distribution of a multi-emitter lighting device may be optimized to a dominant color of the surface or adjusted to highlight a less obvious color.

In one embodiment, one or more sensors may be used to sense properties of light reflected by the target surface (e.g., reflectance spectral distribution and/or reflected spectral power distribution), with the output of the one or more sensors being supplied to at least one circuit element associated with the lighting device to automatically select or recommend (e.g., for approval by a user) one or more operating settings to emphasize and/or deemphasize perception of at least one color for illumination of specific types of target surfaces. Such sensor(s) may include, for example, one or more of the following: light meters, photodiodes, photometers, and charge coupled devices. In one embodiment, one or more LEDs associated with the multi-emitter lighting device may operate as a photodiode to sense one or more properties of light reflected by the target surface.

Selection of and/or status of predefined operating states may identified to a user via one or more user-perceptible outputs. In one embodiment, a solid state lighting device includes an audible sound generator adapted to output one or more beeps or tones corresponding to selection of different operating modes. In one embodiment, a solid state lighting device includes a speech generator adapted to output audible speech adapted to identify operating mode or operating status of the device. In one embodiment, a solid state lighting device includes a visual status identification element such as one or more indicator lights separate from the plurality of emitters arranged for primary lighting utility. In another embodiment, one or more emitters of the plurality of solid state emitters are arranged to temporarily flash, brighten, or darken in a predefined sequence upon selection of an operating mode to identify operating mode or operating status of the solid state lighting device. In one embodiment, operation of a status identification element (e.g., audible or visible) may be selectively enabled or disabled by a user via a user input element.

In one embodiment, the plurality of solid state emitters may be disposed in a common emitter package. The emitter package preferably includes at least one, more preferably at least two, and still more preferably all three, of the following features (a) to (c): (a) a common leadframe including a plurality of conductive leads arranged to supply current to the solid state emitters; (b) a common substrate arranged to structurally support the solid state emitters; and (c) a common reflector arranged to reflect light emissions of each solid state emitter of the plurality of solid state emitters. Placing multiple emitters of different colors in a single package may enhance color mixing by placing the different color sources close together.

Solid state emitters of any desirable wavelengths and wavelength ranges may be utilized in various embodiments of the present invention. A plurality of emitters may include one or more white emitters (e.g., one or more blue LEDs combined with yellow phosphors, and/or one or more ultraviolet LEDs combined with red, green, and blue phosphors), or near-white emitters (e.g., blue-shifted yellow combinations of LEDs and phosphors). Whether or not in combination with at least one white emitters and/or near-white emitters, a plurality of emitters may further include one or more (preferably multiple) emitters that are principally red, principally blue, principally green, principally cyan, and principally yellow and/or amber. Emitters of multiple different colors (e.g., preferably at least two, more preferably at least three, more preferably at least four, and more preferably at least five) of the foregoing colors or color ranges are preferably provided in a single lighting device.

The term "principally red" as applied to a solid state emitter herein refers to an emitter having dominant or peak output emissions within a wavelength range of preferably from about 590 nm to about 680 nm, more preferably from about 595 to about 675 nm, more preferably from about 600 to about 670 nm, and still more preferably from about 610 to about 660 nm.

The term "principally blue" as applied to a solid state emitter herein refers to an emitter having dominant or peak output emissions within a wavelength range of preferably from about 400 nm to about 480 nm, more preferably from about 405 nm to about 475 nm, more preferably from about 410 nm to about 470 nm, and still more preferably from about 420 nm to about 460 nm.

The term "principally green" as applied to a solid state emitter herein refers to an emitter having dominant or peak output emissions within a wavelength range of preferably from 510 nm to 575 nm, or more preferably between 510 nm and 575 nm.

The term "principally cyan" as applied to a solid state emitter herein refers to an emitter having dominant or peak output emissions within a wavelength range of preferably from 480 nm to 510 nm.

The term "principally yellow and/or amber" as applied to a solid state emitter herein refers to an emitter having dominant or peak output emissions within a wavelength range of preferably from above 575 to 590 nm.

While solid state emitters and lumiphoric materials are recognized to have relatively narrow wavelength emission ranges (e.g., full width/half maximum wavelength spectra of less than about 20 nm in many instances), is to be understood that assignment of individual colors to such emitters and conversion materials refers to peaks (e.g., centers) of output wavelengths. That is, individual emitters and lumiphoric materials typically have dominant or peak wavelengths where emissions are maximized, but an individual emitter or lumiphoric material may emit a range of other wavelengths (typically at substantially reduced intensity and efficiency) than its dominant or peak wavelength.

In one embodiment, current is independently controllable to each emitter of a plurality of solid state emitters in a single device or package, or, alternatively, to different groups of solid state emitters of different principal colors. Independent control of current to different solid state emitters of different principal colors enables a user to adjust or tune output color, as well as adjust luminous flux. In one embodiment, at least one current adjuster may be directly or switchably electrically connected to each solid state emitter or different groups of solid state emitters, to adjust current. In one embodiment, one or more solid state emitters of a plurality of emitters may be deactivated while current is supplied to other solid state emitters to provide desired luminous flux and/or output color. In one embodiment, the number and/or size of emitters of different principal colors may be adjusted to provide desired luminous flux and/or output color. In one embodiment, any one or more of the foregoing methods for tailoring aggregated emissions of a solid state emitter package may be combined for additional advantage.

Figure 7:
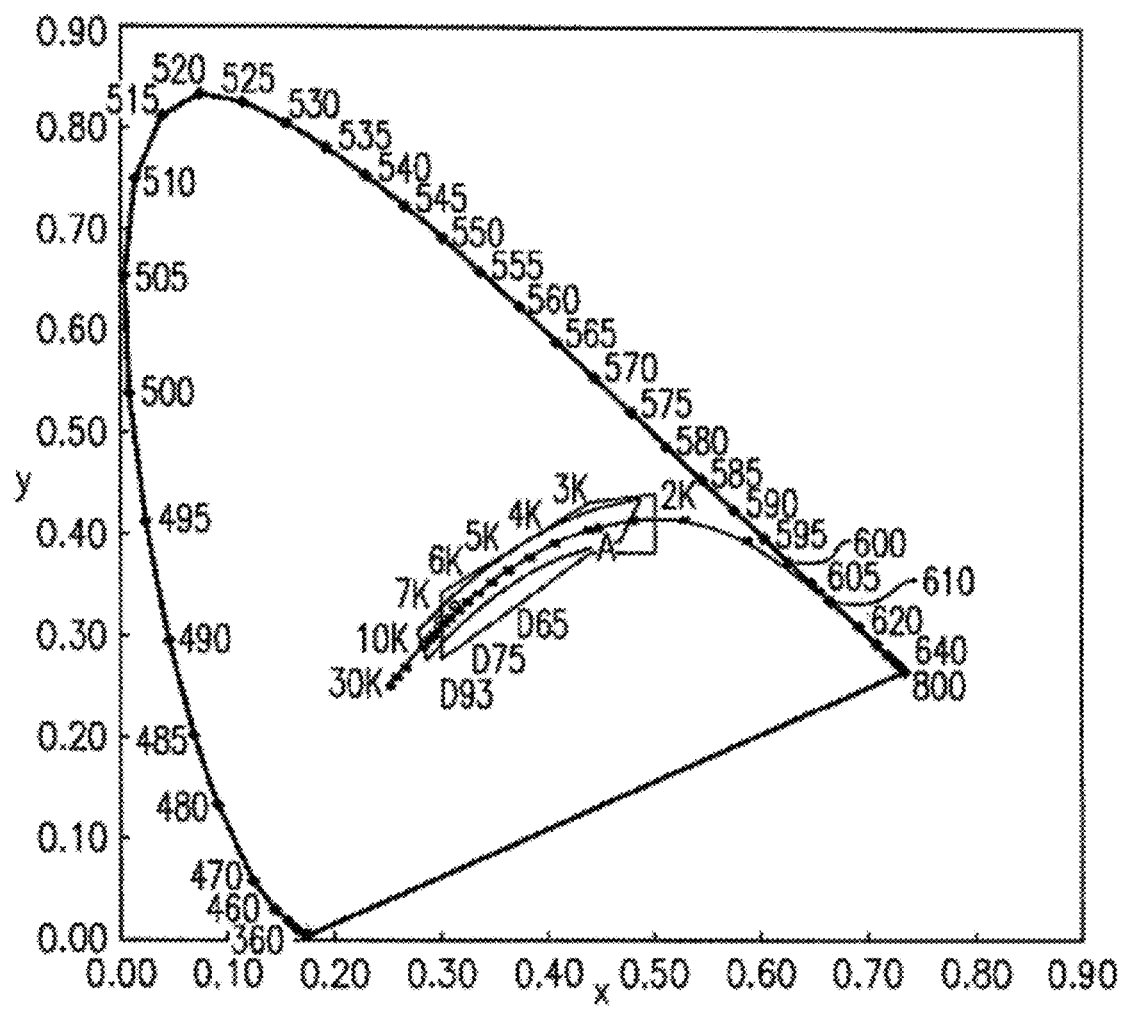
FIG. 7 is a CIE diagram illustrating the blackbody locus and a region of white light.

In one embodiment, solid state emitters of multiple different principal colors within a package or device as described herein may be operatively adjusted or controlled to triangulate to one or more points along or near a blackbody locus drawn on a CIE chromaticity diagram, such as shown in FIG. 7 (with the curved line emanating from the 800 nm corner representing the blackbody locus). In one embodiment, the preceding one or more points may be within ten MacAdam ellipses of at least one point on the blackbody locus on a 1931 CIE Chromaticity Diagram.

In one embodiment, a plurality of solid state emitters includes multiple emitters of the same principal color (i.e., principally red, principally blue, principally cyan, principally yellow, and/or principally amber), with multiple emitters of the same principal color having peak output emissions at different wavelengths. Such emitters of the same principal color may have peak output emissions at wavelengths that differ, with such peak wavelengths in some cases differing by preferably at least about 2 nm, more preferably at least about 4 nm, more preferably at least about 8 nm, more preferably at least about 15 nm, more preferably at least about 30 nm, and still more preferably at least about 40 nm. For example, two principally red LEDs may include a first red emitter having peak emissions at a wavelength of about 640 nm and a second Portland orange LED having peak emissions at 605 nm (representing a difference of 35 nm relative to the 640 nm red LED); two principally green LEDs may include a first green LED having peak emissions of a wavelength of about 525 nm and a second green LED having peak emissions of a wavelength of about 560 nm; and two principally blue LEDs may include a first blue LED having peak emissions at a wavelength of about 450 nm and a second blue LED having peak emissions at a wavelength of about 460 nm. Preferably, current to each emitter is independently controllable. Use of multiple emitters within the same principal color having different peak wavelengths provides enhanced color control capability, and enhances spectral width of aggregated emissions. Multiple emitters of different principal colors (optionally including multiple emitters within any one or more different principal colors) may be provided in conjunction with one or more white or near-white emitters (e.g., as embodied in a combination of a solid state emitter with one or more phosphors). Individual control of current to each solid state emitter of a plurality of solid emitters enables adjustment of balance and color hues of the plurality of emitters.

In certain embodiments, each solid state emitter of a multi-emitter device or package is primarily characterized by output emissions in the visible range. Various embodiments of solid state emitter devices or packages as disclosed herein may be devoid of any solid state emitter having peak output emissions in the ultraviolet spectrum.

In one embodiment, at least one solid state emitter has an associated filtering element adapted to interact with the at least one solid state emitter, such as to attenuate particular spectral content output by the emitter(s). Such a filtering element may be associated with a single solid state emitter or multiple solid state emitters (to render same "filterable" emitter(s)). A filtering element may be conformally coated over one or more solid state emitters. A filter may be applied in the form of a film, or may constitute particles dispersed in media such as a binder, adhesive, or encapsulant. Thickness and/or concentration of a filtering element may be varied with respect to individual solid state emitters to vary degree and/or effect of filtering. A filtering element may be passive, or may be actively controlled. One example of an active filtering element includes a liquid crystal element. Voltage may be applied to the liquid crystal element to selectively affect alignment of liquid crystals and thereby increase or decrease filtering utility. An active filtering element may be deposited as a film on or over one or more emitters. In one embodiment, an active filtering element may be spatially separated (or remotely located) from one or more emitters to reduce conductive heating of the filtering element by the emitter(s). A remotely located filtering element may be insubstantially thermally coupled with an associated solid state emitter. Remote placement of a filtering element may be beneficial to promote mixing between emissions of emitters of different principal colors. In various embodiments, the distance between a solid state emitter and remotely located filtering element may be preferably about 0.5 mm, more preferably about 1.0 mm, more preferably about 1.5 mm.

A passive filtering element may be applied over a solid state emitter of one color that is paired with an emitter of a like color or opposite color (e.g., relative to a color wheel) that is devoid of such a filtering element. Selective operation of the filtered and unfiltered emitter may emphasize or deemphasize perception of a particular color affected by the filter. For example, an emitter having a filter adapted to attenuate transmission of green wavelengths may be selectively activated to selectively deemphasize perception of a green color on a target surface. A magenta emitter or emitter combination (e.g., combination of blue and red) may be additionally or alternatively activated to affect perception of green color on a target surface.

Additional examples of filters and lumiphors utilized in combination with solid state emitters are disclosed in U.S. Patent Application Publication No. 2008/0130265, which is hereby incorporated by reference as if set forth fully herein. Such publication discloses use of a light filter with a solid state emitter, wherein at least a portion of light emitted by the light emitter contacts the filter, and at least part of the light passes through the filter. A lumiphor may be provided in combination with a solid state emitter and filter, in which case at least some light emitted by the solid state emitter is absorbed by the lumiphor, which responsively emits light, and at least a portion of any light emitted by the lumiphor directed toward the filter may be reflected by the filter. A lighting device may further include a solid state light emitter; a lumiphor, and a filtering element that allows at least a portion of light emitted by the light emitter to pass through and that reflects a second portion of light emitted by the lumiphor upon excitation of the lumiphor.

In certain embodiments, a plurality of solid state emitters as disclosed herein may have associated therewith one or more luminescent (also called lumiphoric') materials, such as phosphors, scintillators, lumiphoric inks), to generate receive light of an input wavelength range and responsively re-emit light of a different peak wavelength (or wavelength range) of any of various desired colors—including combinations of colors that may be perceived as white. Lumiphoric materials may provide up-converting or down-converting utility (i.e., outputting higher peak wavelength or lower peak wavelength spectra, respectively). Inclusion of lumiphoric materials in solid state emitter packages may be accomplished by adding such materials to encapsulants, adding such materials to lenses, or by direct coating of such materials onto one or more LEDs. Lumiphoric materials may be conformally coated on one or more individual solid state emitters. In one embodiment, a thicker coating and/or greater concentration of lumiphoric material (e.g., relative to a binder) may be applied to an individual solid state emitter or group of solid state emitters relative to another solid state emitter or group of emitters. Other materials, such as dispersers, scattering materials, and/ or index matching materials, may be included in encapsulants, whether or not combined with lumiphoric materials. Various optical elements, including but not limited to collimators, may also be provided in a solid state emitter package according to embodiments of the present invention.

In one embodiment, at least one lumiphoric material may be remotely located (i.e., spatially separated) from a solid state emitter. Remote placement of at least one lumiphoric material may be accomplished by separating a lumiphoric material from a solid state emitter by an intervening material and/or void. A remotely located lumiphoric material may be insubstantially thermally coupled with an associated solid state emitter. Remote placement of a lumiphoric material may be beneficial to promote mixing between emissions of emitters of different principal colors. In various embodiments, the distance between a solid state emitter and remotely located phosphor(s) may be preferably about 0.5 mm, more preferably about 1.0 mm, more preferably about 1.5 mm.

Emissions from a solid state emitter having an associated lumiphoric material may be fully absorbed by the lumiphor (for responsive conversion to another wavelength), or only partially absorbed, such that a solid state emitter and lumiphor in combination may be adapted to emit one color peak or two color peaks (with each color peak preferably being in the visible range).

One or more lumiphoric materials (e.g., one or more first lumiphor(s) and one or more second lumiphor(s)) may be used in embodiments of the present invention. Each of the at least one first lumiphor and the at least one second lumiphor can individually comprise (or can consist essentially of, or can consist of) a phosphor. Each lumiphoric material can, if desired, further comprise (or consist essentially of, or consist of) one or more highly transmissive (e.g., transparent or substantially transparent, or somewhat diffuse) binders, e.g., made of epoxy, silicone, glass, or any other suitable material. For example, if a lumiphoric material comprises one or more binders, then one or more phosphors can be dispersed within the one or more binders. In general, the thicker the lumiphor, then the lower the weight percentage of the phosphor may be. Depending on the overall thickness of the lumiphor, the weight percentage of the phosphor could be generally any value, e.g., from 0.1 weight percent to 100 weight percent In one embodiment, at least one lumiphoric material is arranged to interact with at least one solid state emitter, and convert at least some incident emissions from one or more solid state emitters to output emissions of a different peak wavelength or wavelength range. The degree of difference between a peak wavelength of the at least one lumiphoric material and a peak wavelength of at least one associated solid state emitter is preferably at least about 10 nm, more preferably at least about 20 nm, more preferably at least about 30 nm, more preferably at least about 40 nm, and still more preferably at least about 50 nm.

Referring now to FIG. 3, a solid state light emitter package 50 according to some embodiments of the present invention includes multiple (e.g., four) independently controllable solid state emitters 12A-12D arranged over (i.e. on or adjacent to) a common submount 14 and a common leadframe 11. While four solid state emitters 12A-12D are illustrated in FIG. 3, it is to be understood that any desirable number of solid state emitters (e.g., two, three, five, six, or more) may be embodied in a single package. The package 50 includes a molded package body 10 surrounding or at least partially encasing the leadframe 11 and a lens 20 mounted over a central region of the package 50. Although the lens 20 is shown as being substantially hemispherical in shape, other lens shapes may be used. Conductive traces 19 provided on or over the submount 14, and wirebonds 18, provide electrically conductive paths between the emitters 12A-12D and electrical leads 15A-15D and 16A-16D extending from sides of the package body 10. Double wirebonds 18 may be used as desired to facilitate even distribution of electrical current and reduce heating of the wires. The leads 15A-15D, 16A-16D may be arranged such that leads of opposite polarity type (e.g. anodes or cathodes) are provided on opposite sides of the package body 10, which may facilitate the connection of packages using such leadframes in series. Registration features or molding depressions 8A-8D may be provided adjacent to corners of the in the package body 10. A peripheral reflector 21 may be provided below the lens 20. Any of various optional features, such as mixers, diffusers, etc., may be provided in addition to or instead of the lens 20.

The package 50 may have length and width dimensions of 7.0 mm×9.0 mm, inclusive of the leads 15A-15D, 16A-16D following crimping/trimming thereof. Each emitter of the four emitters 12A-12D disposed in the unitary package may be arranged with lateral edge spacing of less than about 1.0 mm, more preferably less than about 0.5 mm, from at least one adjacent emitter. Such close lateral spacing is desirable to approximate a point source, and thereby minimize perception of discrete color sources when multiple emitters of different colors are operated simultaneously—thus promoting color mixing and shadow reduction. Each solid state emitter 12A-12D may have a top emissive surface (facial) area of about 1.0 mm$^2$. Given the presence of four solid state emitters 12A-12D, the ratio of solid state emitter top emissive surface or facial area to total facial package area (of about 63 mm$^2$) is about 4/63, or about 6.3%. In an alternative embodiment, one or more emitters may have a top emissive surface (facial) area of at least about 1.4 mm$^2$; assuming the presence of four such emitters in the same overall facial package area (about 64 mm$^2$), the ratio of solid state emitter top emissive surface or facial area to total facial package area is at least about 5.6/63, or at least about 8.9%. Multi-emitter packages with integral leadframes, and optionally including integral ESD devices, in similar embodiments may be characterized by ratios of solid state emitter top surface (facial) area to total top surface (facial) package area of preferably at least about 4%, more preferably at least about 5%, more preferably at least about 6%, more preferably at least about 7%, more preferably at least about 8%, more preferably at least about 9%, and still more preferably at least about 10%. In a multi-emitter package as described herein, at least one or each different color solid state emitter (e.g., red and blue, optionally supplemented by at least one supplemental emitter) or different solid state emitter/lumiphor combination (e.g., blue emitter/yellow phosphor combination) preferably has a ratio of solid state emitter top surface area or facial area to overall package top facial area of at least about 1/63 (or about 1.6%), more preferably at least about 1.4/63 (or about 2.2%). In one embodiment, such a package is configured with multiple solid state emitters of different principal colors, including at least one lumiphor-converted solid state emitter (e.g., to produce white light or light of any suitable color or dominant that may be different from, or substantially the same as, emissions of one or more of the other solid state emitters).

Presence of multiple independently controllable solid state emitters of different color provides design flexibility for applications requiring color changing with high flux from compact lighting sources. Each emitter of a multi-emitter package as disclosed herein is preferably closely spaced to provide enhanced color mixing and shadow reduction for desired application. In one embodiment, an entertainment light provides spinning color with high luminous flux. In another embodiment, a color changing light bulb includes at least one solid state emitter package, and preferably multiple packages, as disclosed herein. Such color changing light bulb may be of any suitable type, including, but not limited to, R16, MR16, MR16A, and MR16B bulb types.

Emitter packages as disclosed herein may be integrated with or associated with light mixing elements and/or light devices of various types. In one embodiment, spectral content of an emitter package may be shifted by the inclusion of spatially separated lumiphoric material (e.g., lumiphor films), as disclosed in U.S. Patent Application Publication No. 2007/0170447 to Negley, et al., which is incorporated by reference. First and second lumiphors (e.g., lumiphor films, lumiphor coatings, and/or lumiphor dispersions) are spaced from one another. Preferably, at least one second lumiphor is spaced apart from, and outside of, at least one first lumiphor relative to at least one solid state emitter. Such shifting is preferably accomplished to provide combined emission with improved color rendering index. The presence of spaced-apart lumiphors provides enhanced color mixing, as may be beneficial for use with an emitter package including plural solid state emitters arranged to emit different colors, so as to minimize perception of simultaneous emission of distinct colors. Solid state emitter packages (e.g., packages 50, 50') as described herein may be combined with any one or more features as described in the foregoing U.S. Patent Application Publication No. 2007/0170447 to Negley, et al.

In certain embodiments, emitter packages (e.g., packages 50, 50') as described herein may be enhanced and/or tuned using light scattering materials that are arranged in configurations that are non-uniform relative to the emitters as a group, and/or relative to individual emitters, as disclosed by U.S. Patent Application Publication No. 2008/0308825 to Chakraborty, et al. As indicated previously, it is desirable to place emitters of different colors in close proximity to one another to approximate a point source, and thereby minimize perception of discrete color sources when multiple emitters of different colors are operated simultaneously. Emitter packages as disclosed herein that include multiple emitters (or emitters and emitter/phosphor combinations) of different colors (e.g., emitters 12A-12D of FIG. 3) may be operated in combination to generate light that is perceived at white (or a desired color mix) when a viewer is directly facing the package (e.g., substantially perpendicular to an upper surface of the package body 10), but discrete colors of light (rather than white or another desired color mix) might be perceived by a viewer facing the package from the side (e.g., substantially parallel to an upper surface of the package body 10) or at an angle. To overcome this effect without unduly reducing light intensity emitted perpendicular to an upper surface of the package body 10, one or more scattering elements (e.g., scattering elements dispersed in encapsulant) may be arranged to interact with light that would otherwise emanate from the package at a shallow angle, while light emanating from the emitters in a direction perpendicular to the upper surface of the package body 10 may interact with a reduced concentration (e.g., low concentration or zero concentration), or different type, of scattering elements.

The individually controllable solid state emitters may be driven with any appropriate level of current. In one embodiment, each emitter is adapted to be driven with a current of up to at least about 700 mA. In various embodiments, currents of 350 milliamps, 700 milliamps, or more may be supplied to each emitter within a solid state emitter package. In various embodiment, a light emission package as disclosed herein and including multiple emitters of different principal colors has a total lumen output of preferably at least about 300 lumens, more preferably at least about 350 lumens, and still more preferably at least about 400 lumens. In various embodiments, a solid state emitter package as described herein has a CRI of at least about 80. In various embodiments, a solid state emitter package as described herein has an efficacy of at least about 25 lumens per watt.

With continued reference to FIG. 3, the leadframe 11 preferably comprise a thermally conductive material (e.g., a metal), and preferably defines a heatsink that may or may not be electrically active. The submount 14 may comprise a thermally conductive but electrically insulating material (e.g., aluminum nitride, a ceramic, etc.). The submount 14 may be attached to the leadframe 11 using any conventional method, including use of a thermally conductive paste. Given the electrically insulating character of a preferred submount, traces 19 and wirebonds 18 may be provided to establish electrically conductive paths to and from the solid state emitters 12A-12D.

Electrostatic discharge protection (ESD) devices 13A-13D such as zener diodes (or, alternatively, ESD devices such as ceramic capacitors, transient voltage suppression (TVS) diodes, multilayer varistors, and/or Schottky diodes) are integral to the package 50, and arranged over the submount 14 to protect the solid state emitters 12A-12D from harmful electrostatic discharge. In the illustrated embodiment, each solid state emitter 12A-12D has an associated ESD device 13A-13D. In another embodiment (e.g. if multiple emitters 12A-12D should be connected in series), each separately addressable path or separate conductive path through the device 50 includes an associated ESD device 13A-13D. Each ESD device 13A-13D may be surface mounted on the submount 14.

A thermally conductive heatsink (e.g., metal or other conductive slug) is preferably provided below and in thermal communication with the submount 14 (e.g. via the leadframe 11) to conduct heat away from the solid state emitters 12A-12D to a bottom side of the package 50. The heatsink is preferably electrically inactive, and may be rendered so through use of an electrically insulating submount. The heatsink may be integrally formed with the leadframe (e.g., as a portion of the leadframe of a thicker gauge or otherwise enhanced mass and/or thickness), or a heatsink may be placed proximate to the leadframe, according to any suitable manufacturing process. If a submount is provided, the heatsink is preferably longer and/or wider than the submount to enhance lateral dispersion of heat emanating from the solid state emitters.

In one embodiment, the submount 14 may be eliminated, with the emitters 12A-12B (and optional ESD devices 13A-13D) being mounted on or over a leadframe 11. The leadframe may or may not be electrically active. If desired to electrically isolate part or all of the leadframe, an electrically insulating material (e.g., thin film or selectively patterned area) may be arranged between the leadframe and the emitters, with electrical traces and/or wirebonds included to provide electrical connection to the emitters and/or ESD devices. 13A-13D. Alternatively, or additionally, an electrically insulating material may be disposed between at least a portion of the leadframe and an underlying heatsink or slug to promote electrical isolation of the heatsink or slug. In another embodiment, solid state emitters (with optional ESD devices) may be mounted on or over a heatsink or slug. The heatsink or slug may be electrically active and used as a bottom side contact for devices mounted thereon, with an electrically insulating material optionally being arranged below the heatsink or slug. Alternatively, or additionally, an electrically insulating material may be disposed or selectively patterned between the heatsink or slug and the emitters arranged thereon.

In one embodiment, the emitters 12A-12D include a principally red LED 12D, a principally blue LED 12B lacking a phosphor, a principally green LED 12C, and another principally blue LED 12A having an associated yellow (or other) phosphor—with the blue LED 12A/yellow phosphor combination arranged to emit white light. Each solid state emitter 12A-12D is independently controllable via different pairs of the leads 15A-16A, 15B-16B, 15C-16C, 15D-16D. The package 50 may therefore be operated with any one, two, three, or four LEDs 12A-12D.

Although the emitters 12A-12D have been described herewith as embodying a specific combination of solid state emitters and a lumiphoric material (e.g., a phosphor), it is to be appreciated that any desired numbers and colors of solid state emitters and lumiphoric materials as disclosed herein may be employed.

FIGS. 4A-4D depict an emitter device package 50' substantially similar to the package 50 illustrated and described in connection with FIG. 3. The package 50' includes four solid state emitters 12A'-12D' arranged over a common submount 14' and a common leadframe 11'. The package 50' includes a molded package body 10' surrounding the submount 14' and a lens 20' mounted over a central region of the package 50'. Conductive traces 19' provided on or over the submount 14', and wirebonds 18', provide electrically conductive paths between the solid state emitters 12A'-12D' and electrical leads 15A'-15D' and 16A'-16D' extending from sides of the package body 10'. The leads 15A'-15D', 16A'-16D' may be arranged such that leads of opposite polarity type (e.g. anodes or cathodes) are provided on opposite sides of the package body 10'. Registration features or molding depressions 8A'-8D' may be formed adjacent to corners of the package body 10'. A peripheral reflector 21' may be provided below the lens 20'. A thermally conductive heatsink or slug 17' (optionally integrated and/or integrally formed with the leadframe 11') is exposed along a back side of the package 50' and is in thermal communication with the submount 14' to conduct heat away from the solid state emitters 12A'-12D'. The heatsink or slug 17' preferably has an exposed surface area that is larger than a facial area of the submount 14'.

Construction details for, and features of, packages including multiple solid state emitters are disclosed in the following U.S. patents and published patent applications: U.S. Patent Application Publication No. 2008/0121921 to Loh, et al.; U.S. Patent Application Publication No. 2008/0012036 to Loh, et al.; U.S. Patent Application Publication No. 2007/0253209 to Loh, et al.; and U.S. Pat. No. 7,456,499 to Loh, et al. Solid state emitter packages as described herein may be combined with any one or more features of the foregoing U.S. patent and U.S. patent application publications to Loh et al., including, but not limited to: dual thickness leadframe construction; general electrical trace patterns; and materials and methods of fabrication of various components.

In one embodiment, a solid state emitter package (e.g., packages 50, 50') such as described above includes multiple lumiphors in addition to multiple solid state emitters. For example, with comparison to the embodiment of FIG. 3, at least two different LEDs 12A-12D may be coated with different lumiphoric materials (e.g., phosphors). Alternatively, multiple lumiphoric materials arranged to interact with emitters of different colors may be combined, and such combination may be coated (e.g., conformally coated) or otherwise disposed over at least two, at least three, or at least four solid state emitters 12A-12D. For example, multiple lumiphoric materials may be combined with an encapsulant and/or coated on or integrated with a lens, with the multiple phosphors being arranged to interact with one solid state emitter, two solid state emitters, or three or more solid state emitters. Various combinations of multiple lumiphoric materials and multiple solid state emitters are described, for example, in U.S. Patent Application Publication No. 2006/0152140 to Brandes, and U.S. Patent Application Publication No. 2007/0223219 to Medendorp, et al., which are incorporated by reference herein. By appropriate selection of LED die components and phosphor species, a close approach to the color temperature of interest can be achieved in the light output of the light emission device. Sizes (e.g., emissive area or frontal area) and/or numbers of individual emitters disposed within a multi-emitter package may be varied to at least partially compensate for performance differences among emitters of different colors, as described in U.S. Patent Application Publication No. 2006/0152140 to Brandes.

Devices according to the present invention may be used as described in U.S. Pat. No. 7,213,940, which is hereby incorporated by reference as if set forth fully herein. A combination of light exiting a solid state emitter package as disclosed herein, may, in an absence of any additional light, produce a sub-mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38).

Figure 5:
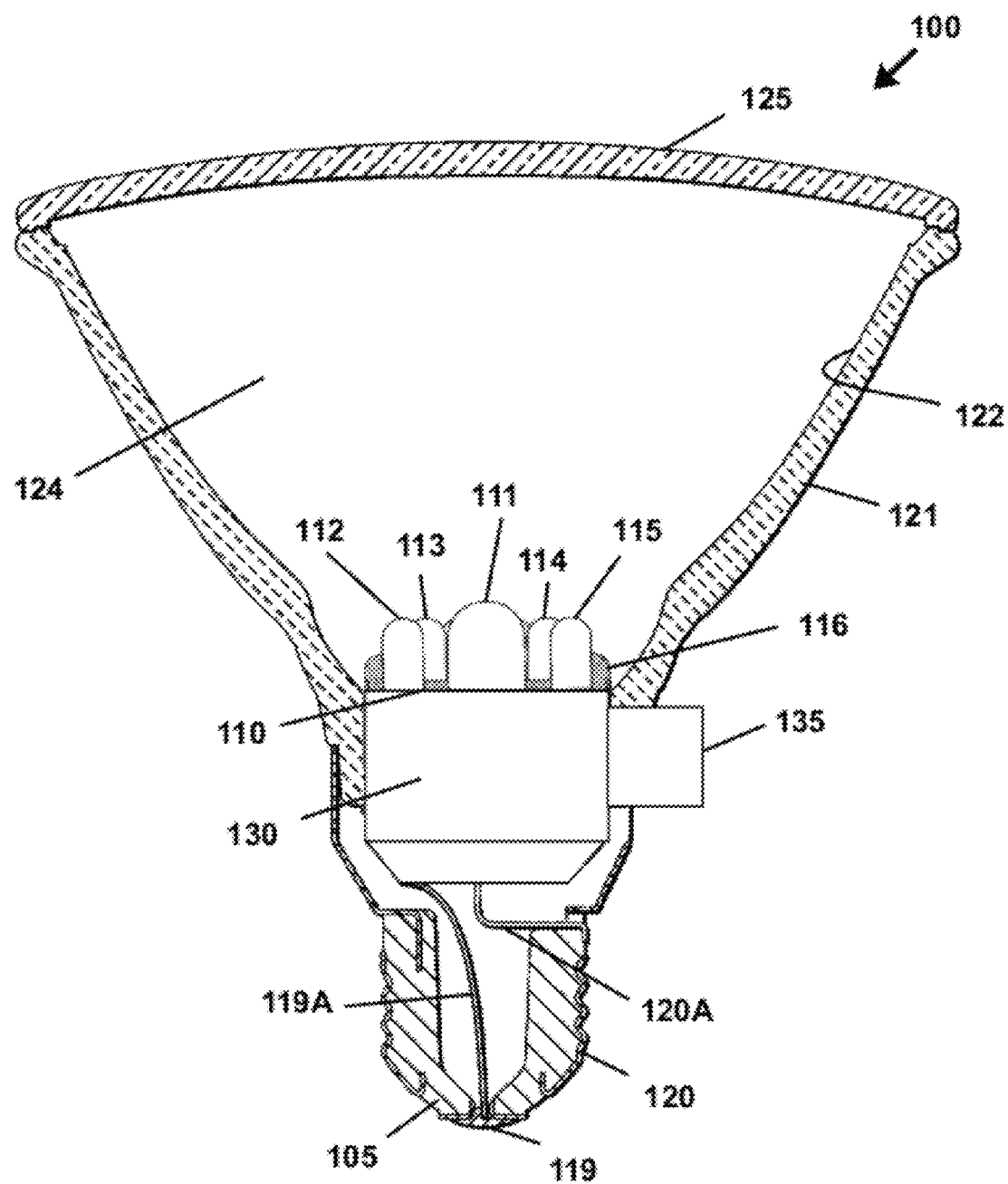
FIG. 5 is a simplified cross-sectional view of a self-ballasted LED reflector light bulb according to one embodiment of the present invention, the bulb having a threaded screw-type base, and sized and shaped to replace a conventional incandescent bulb.

One embodiment includes a lamp or light bulb including a plurality of solid state emitters as disclosed herein, with the lamp or light bulb sized and shaped to replace a conventional incandescent or halogen bulb—such as, but not limited to, an A19 bulb or PAR 38 bulb—and adapted to operate as described herein. Structures and methods according to the present invention may be embodied in or performed with lamps and bulbs of other standard types, as will be recognized by one skilled in the art. Referring to FIG. 5, a solid state lamp or light bulb 100 includes a threaded screw-type Edison base 105 having a protruding base contact 119 and a separate threaded contact 120, with the contacts 119, 120 arranged to mate with a female socket of a conventional light fixture (not shown). In view of thermal output of high power solid state emitters, it is recognized that heat transfer from the bulb 100 may be enhanced with one or more fins (not shown) or other structures adapted to promote heat transfer. Multiple LEDs 111-115 are mounted on a substrate 110 or other surface within a cavity 124 formed by a reflector 121 having a reflective inner surface 122. As shown in FIG. 5, the LEDs 111-115 may differ in size relative to one another. In one embodiment, a larger emitter 111 comprises a white or near-white LED, with non-white emitters embodying smaller-sized LEDs 112-115. A lens 125 is disposed over one end of the reflector cavity 124. Potting material or a sealant 116 may be disposed proximate to the LEDs 111-115. Upon insertion of the bulb 100 into a mating electrical socket (not shown), power is supplied to the bulb 100 through the contacts 119, 120 and associated internal conductors 119A, 120A. At least one circuit element 130 receives power from the conductors 119A, 120A and control operation the LEDs 111-115 emitters to output an aggregated spectral power distribution selected to emphasize and/or deemphasize perception of at least one color of a target surface. The at least one circuit element 130 preferably includes a ballast. A user input element 135 may be operatively coupled to the circuit element(s) 130, to permit alteration of emphasis or deemphasis of perception of at least one color of a target surface. In one embodiment, the user input element 135 may include at least one manually operable button, dial, slider, or switch. In another embodiment, the user input element 135 may include a wireless receiver adapted to receive an input signal from an associated wireless transmitter (not shown) to effectuate alteration of emphasis and/or deemphasis of perception of color of at least one target surface, whether by adjusting operation of one or more emitters individually, or by selection of one or more predetermined operating settings as described hereinabove.

Although the bulb shown in FIG. 5 includes multiple discrete LEDs 111-115, it is to be recognized that one or more multi-emitter packages (such as the packages 50, 50' disclosed hereinabove) may be substituted for discrete LEDs. Multiple multi-emitter packages may be wired in parallel or in series, and may be controlled together or separately.

Figure 6:
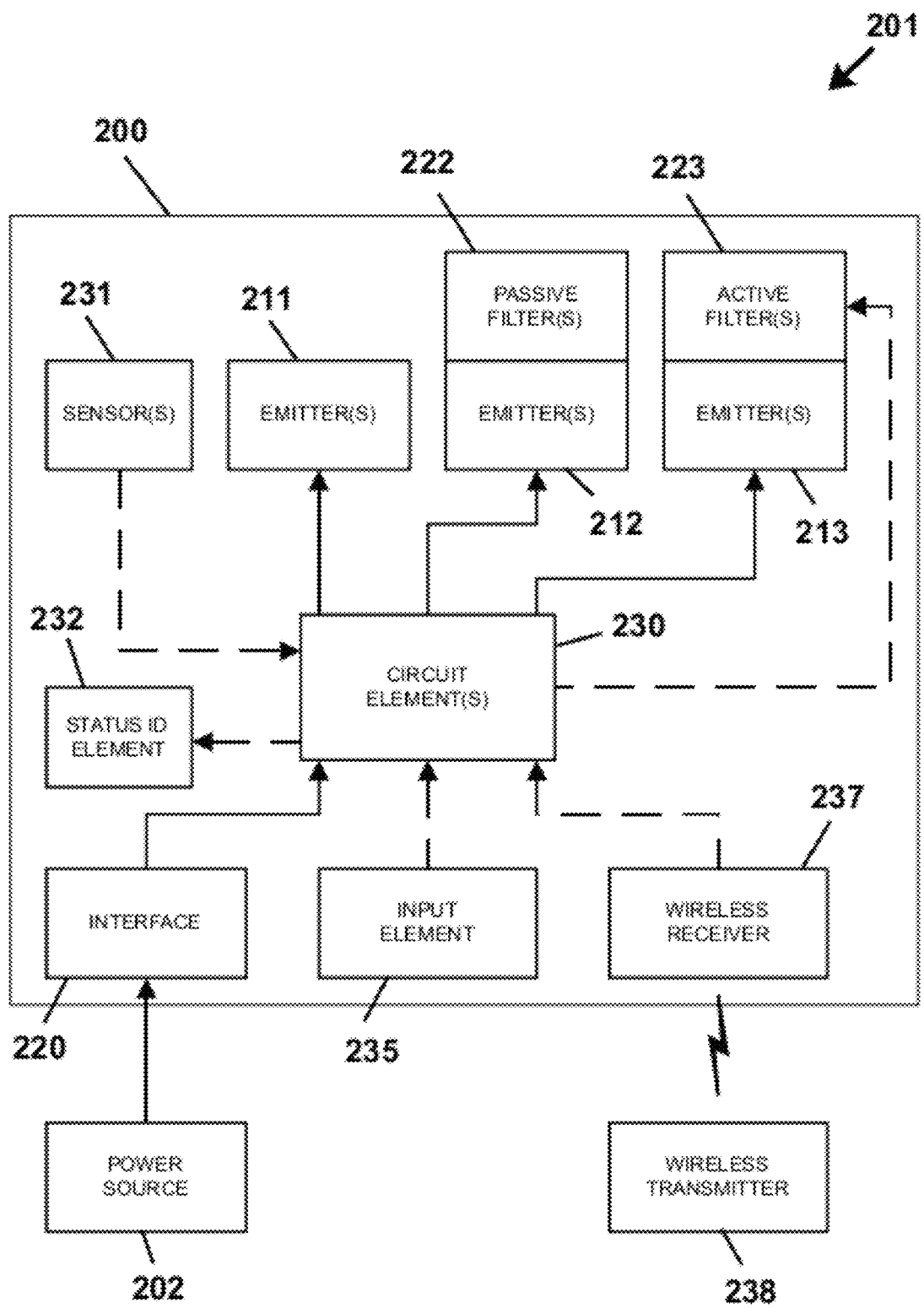
FIG. 6 is a schematic showing interconnections between various components of a lighting device according to one embodiment of the present invention.

FIG. 6 provides a schematic diagram showing interconnections between various components of a multi-emitter lighting device 200 within a lighting system 201 according to one embodiment of the present invention. The lighting system 201 includes a lighting device 200 operatively connected to a power source 202 via an interface 220 (e.g., one or more electrical contacts, such as may be associated with a socket or plug). One or more circuit elements 230 is arranged to receive power from the power interface 220, and to receive user input commands from a local user input element 235 and/or a wireless receiver 237 arranged to receive signals from an associated wireless transmitter 238. The at least one circuit element 230, which may include a memory and/or a microprocessor, is operatively coupled to multiple solid state emitters 211, 212, 213. Certain emitters 212, 213 (optionally including one or more associated lumiphoric materials) may have associated filters 222, 223, such as at least one passive filter optionally associated with emitter(s) 212, and at least one active filter optionally associated with emitter(s) 213. At least one sensor 231 may be arranged to provide signals to the at least one circuit element 230. One or more sensors 231 may be provided to sense reflectance spectral distribution or reflected spectral power distribution of a target surface, and/or to sense any desirable condition relating to operation of the lighting device 201, such as, but not limited to, time (e.g., operating duration), temperature, pressure, shock, voltage, and/or current. One or more status identification elements 232 may be operatively connected to the at least one circuit element 230 to provide at least one user-perceptible output signal (e.g., audible, visible, vibratory, etc.) indicative of operating mode or operating status of the device. In one embodiment, the status identification element provides a wired or wireless signal indicative of device operating status to a user-operated device, a local monitoring device, or a remote monitoring station.

The lighting device 200 may be operated as described herein. The lighting device 200 may be disposed proximate to a target surface (not shown). Individual control of current to each solid state emitter 211, 212, 213 (or groups of like solid state emitters), and to the active filtering element 223, by the at least one circuit element 230 enables adjustment of balance and color hues of the plurality of emitters 211-213 to achieve desired emphasis of perception and/or deemphasis of perception of at least one color of the target surface. Such control of the emitters 211-213 and optional active filter 223 may include one or more predefined operating states or settings and/or one or more states selected or recommended by the circuit elements responsive to a signal received from the at least one sensor 231. An aggregated spectral power distribution of the device 200 preferably includes white light while the solid state emitters 211-213 are controlled to emphasize and/or deemphasize perception of at least one color of a target surface.

One embodiment includes a lamp or light fixture including at least one multi-emitter device, package, or bulb as disclosed herein. In one embodiment, a light fixture includes a plurality of solid state emitter packages. In one embodiment, multiple solid state emitter packages as disclosed herein may be operatively connected (e.g., in parallel or in series) and/or integrated in a single lamp or fixture. In one embodiment, multiple solid state emitter devices, packages, or bulbs as disclosed herein may be operatively coupled to at least one common current adjusting element. In another embodiment, each solid state emitter device, package, or bulb may have at least one dedicated current adjuster. In one embodiment, a light fixture is arranged for recessed mounting in ceiling, wall, or other surface. In another embodiment, a light fixture is arranged for track mounting.

The foregoing disclosure thus discloses various devices, packages, bulbs, lamps, and fixtures each including multiple LEDs, with features to emphasize and/or deemphasize perception of at least one color for illumination of specific types of target surfaces.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Any of various elements or features recited herein are contemplated for use in combination with other features or elements disclosed herein, unless specified to the contrary. Correspondingly, the invention as hereinafter claimed is intended to be broadly construed and interpreted, as including all such variations, modifications and alternative embodiments, within its spirit and scope.

What is claimed is:

1. A lighting device adapted to emphasize and/or deemphasize perception of at least one color of a target surface having a characteristic reflectance spectral distribution and being separate from the lighting device, the lighting device comprising:
    a plurality of solid state emitters including a first solid state emitter having peak output emissions at a first wavelength, and including a second solid state emitter having peak output emissions at a second wavelength that differs from the first wavelength; and
    at least one circuit element adapted to control operation of the plurality of solid state emitters to output an aggregated spectral power distribution selected to emphasize and/or deemphasize perception of at least one color of a target surface based upon the reflectance spectral distribution of the target surface.

2. The lighting device of claim 1, wherein the aggregated spectral power distribution comprises white light.

3. The lighting device of claim 1, further comprising at least one lumiphoric material arranged to convert at least some emissions from any of the first solid state emitter and the second solid state emitter.

4. The lighting device of claim 1, wherein the plurality of solid state emitters includes a third solid state emitter having peak output emissions at a third wavelength that differs from the first wavelength and the second wavelength.

5. The lighting device of claim 4, wherein the plurality of solid state emitters includes a fourth solid state emitter having peak output emissions at a fourth wavelength that differs from the first wavelength, the second wavelength, and the third wavelength.

6. The lighting device of claim 5, wherein the first solid state emitter comprises a principally red solid state emitter, the second solid state emitter comprises a principally blue solid state emitter, the third solid state emitter comprises a principally green solid state emitter, and the fourth solid state emitter comprises at least one emitter operatively coupled with a lumiphoric material to output white or near-white light.

7. The lighting device of claim 1, wherein the at least one circuit element is adjustable by a user to control operation of the plurality of solid state emitters to output an aggregated spectral power distribution to alter emphasis and/or deemphasis of perception of at least one color of the target surface.

8. The lighting device of claim 1, wherein the at least one circuit element includes a plurality of predetermined settings to control operation of the plurality of solid state emitters, wherein at least one setting of the plurality of predetermined settings causes the plurality of solid state emitters to output an aggregated spectral power distribution selected to emphasize and/or deemphasize perception of at least one color of the target surface.

9. The lighting device of claim 1, comprising a user input element operatively coupled to the at least one circuit element, wherein each setting of the plurality of predetermined settings is selectable via the user input element.

10. The lighting device of claim 1, comprising a wireless receiver operatively coupled to the at least one circuit element, wherein the wireless receiver is adapted to receive an input signal to effectuate alteration of emphasis and/or deemphasis of perception of at least one color of a target surface.

11. The lighting device of claim 1, comprising an output element adapted to generate a user-perceptible signal indicative of operating mode or operating status of the lighting device.

12. The lighting device of claim 1, adapted to automatically switch between multiple settings of the plurality of settings.

13. The lighting device of claim 1, adapted to emphasize perception of a color of the target surface.

14. The lighting device of claim 1, adapted to deemphasize perception of a color of the target surface.

15. The lighting device of claim 1, adapted to emphasize perception of a first color of the target surface, and to simultaneously deemphasize perception of a second color of the target surface.

16. The lighting device of claim 1, further comprising at least one of the following elements (a) to (c):
    (a) a common leadframe including a plurality of conductive leads arranged to supply current to the plurality of solid state emitters;
    (b) a common substrate arranged to structurally support the plurality of solid state emitters; and
    (c) a common reflector arranged to reflect light emissions of each solid state emitter of the plurality of solid state emitters.

17. The lighting device of claim 1, further comprising at least one filtering element arranged to interact with at least one solid state emitter of the plurality of solid state emitters.

18. The lighting device of claim 17, wherein the at least one filtering element comprises a liquid crystal element.

19. A self-ballasted lamp or light fixture comprising the lighting device of claim 1.

20. The lighting device of claim 1, further comprising at least one sensor arranged to sense reflectance spectral distribution of the target surface or reflected spectral power distribution of the target surface.

21. A method comprising:
    identifying a color associated with a target surface to be emphasized or deemphasized, the target surface having a characteristic reflectance spectral distribution and being separate from the lighting device;
    selecting a lighting device comprising a plurality of solid state emitters, or selecting an operating mode of a lighting device comprising a plurality of solid state emitters, to output an aggregated spectral power distribution adapted to emphasize or deemphasize the identified color based upon the reflectance spectral distribution of the target surface, wherein the plurality of solid state emitters includes a first solid state emitter having peak output emissions at a first wavelength, and a second solid state emitter having peak output emissions at a second wavelength that differs from the first wavelength; and
    illuminating the target surface with an aggregated spectral power distribution output by the plurality of solid state emitters to emphasize or deemphasize perception of the identified color.

22. The method of claim 21, comprising selecting a lighting device comprising a plurality of solid state emitters to output an aggregated spectral power distribution adapted to emphasize or deemphasize the identified color based upon the reflectance spectral distribution of the target surface.

23. The method of claim 21, comprising selecting an operating mode of a lighting device comprising a plurality of solid state emitters, to output an aggregated spectral power distribution adapted to emphasize or deemphasize the identified color based upon the reflectance spectral distribution of the target surface.

24. The method of claim 23, comprising receiving a user input and responsively adjusting operation the plurality of solid state emitters to output an aggregated spectral power distribution to alter emphasis and/or deemphasis of perception of at least one color of the target surface.

25. The method of claim 24, wherein the user input is received via wireless transmission.

26. The method of claim 21, wherein said identifying includes use of at least one sensor to sense reflectance spectral distribution of the target surface or reflected spectral power distribution of the target surface.

27. The method of claim 26, further comprising automatically recommending, for approval by a user, one or more operating settings of the plurality of emitters to emphasize or deemphasize the identified color responsive to the sensing of reflectance spectral distribution of the target surface or reflected spectral power distribution of the target surface.

28. The method of claim 21, further comprising automatically selecting one or more operating settings of the plurality of emitters to emphasize or deemphasize the identified color responsive to the sensing of reflectance spectral distribution of the target surface or reflected spectral power distribution of the target surface.

29. The method of claim 21, further comprising regulating aggregated lumen output or perceived aggregated lumen output of the plurality of solid state emitters to maintain a substantially constant value while lighting device is subjected to a change in operating mode to emphasize or deemphasize the identified color responsive to the sensing of reflectance spectral distribution of the target surface or reflected spectral power distribution of the target surface.

30. The method of claim 21, wherein the plurality of solid state emitters includes a third solid state emitter having peak output emissions at a third wavelength that differs from both the first wavelength and the second wavelength.

31. The method of claim 21, comprising selecting an operating mode of a lighting device comprising a plurality of solid state emitters to illuminate the target surface with an aggregated spectral power distribution output by the plurality of solid state emitters to emphasize perception of the identified color.

32. The method of claim 21, comprising selecting an operating mode of a lighting device comprising a plurality of solid state emitters to illuminate the target surface with an aggregated spectral power distribution output by the plurality of solid state emitters to deemphasize perception of the identified color.

33. The method of claim 21, wherein the lighting device has a plurality of predefined or user-defined operating modes to output an aggregated spectral power distribution adapted to emphasize or deemphasize the identified color based upon the reflectance spectral distribution of the target surface, and the method comprises automatically cycling between different modes of the plurality of operating modes.

34. The method of claim 21, wherein the lighting device comprises at least one active filtering element arranged to interact with at least one solid state emitter of the plurality of solid state emitters, and the method further comprises controlling the at least one active filtering element to emphasize or deemphasize the identified color based upon the reflectance spectral distribution of the target surface.

35. The method of claim 21, wherein the lighting device comprises at least one passive filtering element arranged to interact with at least one filterable solid state emitter of the plurality of solid state emitters, and the method further comprises selectively operating the at least one filterable solid state emitter to emphasize or deemphasize the identified color based upon the reflectance spectral distribution of the target surface.

36. The method of claim 21, comprising generating a user-perceptible signal indicative of operating mode or operating status of the lighting device.

37. The method of claim 21, comprising storing, in a memory associated with the lighting device, settings for at least one operating mode adapted to output an aggregated spectral power distribution adapted to emphasize or deemphasize the identified color based upon the reflectance spectral distribution of the target surface.

38. The method of claim 21, wherein the aggregated spectral power distribution comprises white light.

* * * * *